(12) United States Patent
White et al.

(10) Patent No.: US 7,665,002 B1
(45) Date of Patent: Feb. 16, 2010

(54) MULTI-CORE INTEGRATED CIRCUIT WITH SHARED DEBUG PORT

(75) Inventors: Scott A. White, Austin, TX (US); Michael T. Clark, Austin, TX (US); Timothy J. Wood, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 399 days.

(21) Appl. No.: 11/302,942

(22) Filed: Dec. 14, 2005

(51) Int. Cl.
*G01R 31/28* (2006.01)
(52) U.S. Cl. .................................. 714/733; 714/727
(58) Field of Classification Search ................ 714/724, 714/726, 727, 729, 733, 734, 742
See application file for complete search history.

(56) References Cited

U.S. PATENT DOCUMENTS

| | | | | |
|---|---|---|---|---|
| 6,122,762 | A * | 9/2000 | Kim | 714/726 |
| 6,142,683 | A | 11/2000 | Madduri | |
| 6,158,032 | A * | 12/2000 | Currier et al. | 714/726 |
| 6,415,393 | B2 * | 7/2002 | Satoh | 714/30 |
| 6,446,221 | B1 * | 9/2002 | Jaggar et al. | 714/30 |
| 6,614,263 | B2 * | 9/2003 | Nadeau-Dostie et al. | 326/93 |
| 6,629,268 | B1 | 9/2003 | Arimilli et al. | |
| 6,668,339 | B1 * | 12/2003 | Maeda | 714/38 |
| 6,681,359 | B1 * | 1/2004 | Au et al. | 714/733 |
| 6,711,602 | B1 * | 3/2004 | Bhandal et al. | 708/625 |
| 6,718,294 | B1 * | 4/2004 | Bortfeld | 703/20 |
| 6,950,963 | B1 | 9/2005 | Parson | |
| 7,000,092 | B2 | 2/2006 | Gehman et al. | |
| 7,010,722 | B2 * | 3/2006 | Jahnke | 714/30 |
| 7,096,385 | B1 * | 8/2006 | Fant et al. | 714/30 |
| 7,313,730 | B1 * | 12/2007 | Ryser | 714/30 |
| 2002/0078420 | A1 * | 6/2002 | Roth et al. | 714/798 |
| 2002/0138801 | A1 * | 9/2002 | Wang et al. | 714/729 |
| 2002/0168015 | A1 * | 11/2002 | Whetsel | 375/259 |
| 2003/0061020 | A1 | 3/2003 | Michael | |
| 2003/0146777 | A1 * | 8/2003 | Nadeau-Dostie et al. | 326/93 |

(Continued)

OTHER PUBLICATIONS

The Institute of Electrical and Electronics Engineering, Inc.; IEEE 100 the Authoritative Dictionary of IEEE Standards Terms Seventh Edition; Published Dec. 2000; Seventh Edition, pp. 207-208.*

(Continued)

*Primary Examiner*—Cynthia Britt
(74) *Attorney, Agent, or Firm*—Robert C. Kowert; Meyertons, Hood, Kivlin, Kowert & Goetzel, P.C.

(57) ABSTRACT

A single test access port, such as a JTAG-based debug port may be utilized to perform debug operations on logic cores of a multi-core integrated circuit, such as a multi-core processor. The shared debug port may respond to a particular command to enter a debugging mode and may be configured to forward all commands and data to a debugging controller of the integrated circuit during debugging. A mask register may be used to indicate which logic cores of the multi-core integrated circuit should be debugged. Additionally, custom debugging commands may include mask or core select fields to indicate which logic cores should be affected by the particular command. Debugging mode may be initialized for one or more logic cores either externally, such as be asserted a DBREQ signal, or internally, such as by configuring one or more breakpoints.

20 Claims, 7 Drawing Sheets

U.S. PATENT DOCUMENTS

| | | | |
|---|---|---|---|
| 2003/0163773 A1* | 8/2003 | O'Brien et al. | 714/726 |
| 2004/0006729 A1* | 1/2004 | Pendurkar | 714/733 |
| 2004/0054689 A1* | 3/2004 | Salmonsen et al. | 707/104.1 |
| 2004/0163012 A1* | 8/2004 | Hayase | 714/25 |
| 2004/0168105 A1* | 8/2004 | Haroun et al. | 714/30 |
| 2005/0034017 A1* | 2/2005 | Airaud et al. | 714/25 |
| 2005/0039039 A1 | 2/2005 | Moyer et al. | |
| 2005/0125754 A1 | 6/2005 | Schubert et al. | |
| 2005/0154949 A1 | 7/2005 | Van Treuren et al. | |
| 2005/0160337 A1 | 7/2005 | Whetsel | |
| 2005/0166109 A1 | 7/2005 | Dubey | |
| 2005/0188358 A1* | 8/2005 | Johnson et al. | 717/129 |
| 2005/0193254 A1* | 9/2005 | Yee | 714/30 |
| 2005/0240820 A1* | 10/2005 | Vannerson et al. | 714/35 |
| 2006/0248395 A1* | 11/2006 | McGowan | 714/30 |

OTHER PUBLICATIONS

"Designing IEEE Std 1149.1 Into Your Semiconductor Products," Cron, A.D., ASIC Seminar and Exhibit 1990, Third Annual IEEE, 4 pages.

* cited by examiner

MULTI-CORE INTEGRATED CIRCUIT WITH SHARED DEBUG PORT

BACKGROUND OF THE INVENTION

1. Field of the Invention

This invention is related to the field of integrated circuits, and more particularly, to sharing a debug port among the cores of multi-core integrated circuits.

2. Description of the Related Art

Realizing the importance of emulation techniques in both hardware and software development, most manufacturers of microprocessors and DSP's now incorporate debug and/or testing interfaces into their designs. For instance, a processor emulator may be incorporated into the processor itself. The list of debug interface enabled CPU's includes members of the Intel Pentium processor family, Motorola and IBM PowerPC processor families, as well as AMD, MIPS, ARM and SPARC processor families. The IEEE organization has also published a standard (IEEE-ISTO 5001) for debug interfaces. The various manufacturers may use different names for their debug interfaces, including BDM Port, (hardware debug tool) HDT Port and COP port, but the basic functionality may be quite similar among most implementations.

Access to the testing functions is typically provided via a JTAG compliant port supplemented by 2 or 3 additional special purpose signals. Processor designers may extend the JTAG instruction set to include vendor-specific instructions for controlling the processor core. Low-level debug functions typically include: stop the processor; read/write memory locations; read/write I/O locations; set/remove breakpoints; single step code execution; and code tracing.

As integrated circuits, such as processors, gain complexity multiple logic cores may be included in a single integrated circuit. For instance, a dual-core processor may include two individual logic cores and processors with four or more individual logic cores are common. However, a multi-core integrated circuit, such as a dual-core processor, may only include a single debug port or interface to test the integrated circuit including the logic cores. Traditionally, a single, shared debug port, such as a JTAG interface cannot be used to individually test or debug the logic cores of a multi-core integrated circuit.

SUMMARY

A multi-core integrated circuit, such as a multi-core processor, may include multiple logic cores, but only a single debug or test access port (TAP), such as a JTAG interface. Multiple cores of a multi-core integrated circuit may be controlled, such as for testing or debugging, via a single, shared, debug or test access port interface, according to some embodiments. For instance, a multi-core integrated circuit may include a debug controller or other debug logic circuitry configured to interface with each of the logic cores on the integrated circuit. The debug controller or debug logic circuitry of a multi-core integrated circuit may also be configured to receive test commands received via the debug or test access port. Thus, commands may be issued via the test/debug interface to the debug controller to test and/or debug one or more of the logic cores of a multi-core integrated circuit, according to some embodiments. Additionally, in some embodiments, existing protocols and equipment designed for testing/debugging traditional single core integrated circuit via a test access port may be utilized without modification to perform debug operations on logic cores of a multi-core integrated circuit.

In some embodiments, a debug or test access port of a multi-core integrated circuit may be put into a special debug mode in which all data input to the port may be transferred (or forwarded) to debug controller of the integrated circuit instead of being interpreted and acted upon by the test access port logic. For example, a multi-core processor may include a JTAG-based debug port or test access port (TAP) that may be put into a debug pass-through mode in response to receiving a custom USEDEBUGMODE command, according to one embodiment. When in debug mode debug controller may response to various commands, received via the TAP, to interact with one or more of the logic cores and/or other components of the integrated circuit. For instance, debug mode may be used to read and/or write registers, cache arrays, memory, I/O interfaces, and other areas of each logic core and/or the integrated circuit.

In order to support testing and debugging of either a single or multiple logic cores of a multi-core integrated circuit using a single, shared debug port or TAP, the integrated circuit may include a set of shared common debug controller, such as to interface with a debug port or TAP, and may also include multiple sets of core-specific debug controllers each configured to interact with a single logic core. Additionally, the integrated circuit may include a mask register, a core target register, or other mechanism to determine for which logic core(s) any particular debug command is intended.

A debug or test mode may be initiated in logic cores of an multi-core integrated circuit in different ways, either externally or internally to the integrated circuit. For instance, in one embodiment a multi-core integrated circuit may include a DBREQ line assert-able from outside the integrated circuit that may request the debug controller to cause one or more of the logic cores of the integrated circuit to enter debug (or test) mode, according to some embodiments. When such a DBREQ line is asserted, the debug controller logic may use the value stored in a mask register or a core target register to determine which logic cores to put into debug mode. Thus, in some embodiments, only the core specific debug controller logic for those cores indicated by the mask (core target) register may cause their respective logic cores to enter debug mode.

Alternatively, one or more logic cores may be put into debug or test mode via any of various breakpoint mechanisms, according to some embodiments. For example, a multi-core processor may have an instruction set that includes a breakpoint instruction (such as INT3 in the x86 instruction set) and that breakpoint instruction may be used to cause one or more logic cores to enter debug mode. As with externally initiated debug mode a value in a mask register may be used to determine how many cores are being put into debug mode.

Upon entering debug mode, the debug controller logic may be configured to assert a DBRDY line connected to components outside the integrated circuit to indicate that the logic cores indicated by the mask register have entered debug mode. Thus, whether entering debug mode in response to an asserted DBREQ line or in response to logic core breakpoint mechanisms, debug controller logic may assert DBRDY to indicate that all logic cores selected via the mask register have entered debug mode.

When exiting debug mode, debug controller logic may be configured to de-assert a DBRDY line to indicate that the logic core(s) have exited debug mode. In some embodiments, the debug controller may be configured to assert a DBRDY when the first logic core in debug mode enters debug mode. However, in other embodiments, debug controller logic may be configured to assert the DBRDY pin only after all selected logic cores have entered debug mode. When exiting debug mode, the debug controller may be configured to de-assert the DBRDY pin after only a single one of the selected logic core (that are in debug mode) exits debug mode. Thus, in some embodiments, DBRDY may be considered to reflect the most "conservative" view of the debug mode state within an integrated circuit.

BRIEF DESCRIPTION OF THE DRAWINGS

A better understanding of the present invention can be obtained when the following detailed description is considered in conjunction with the following drawings, in which.

Figure 1:
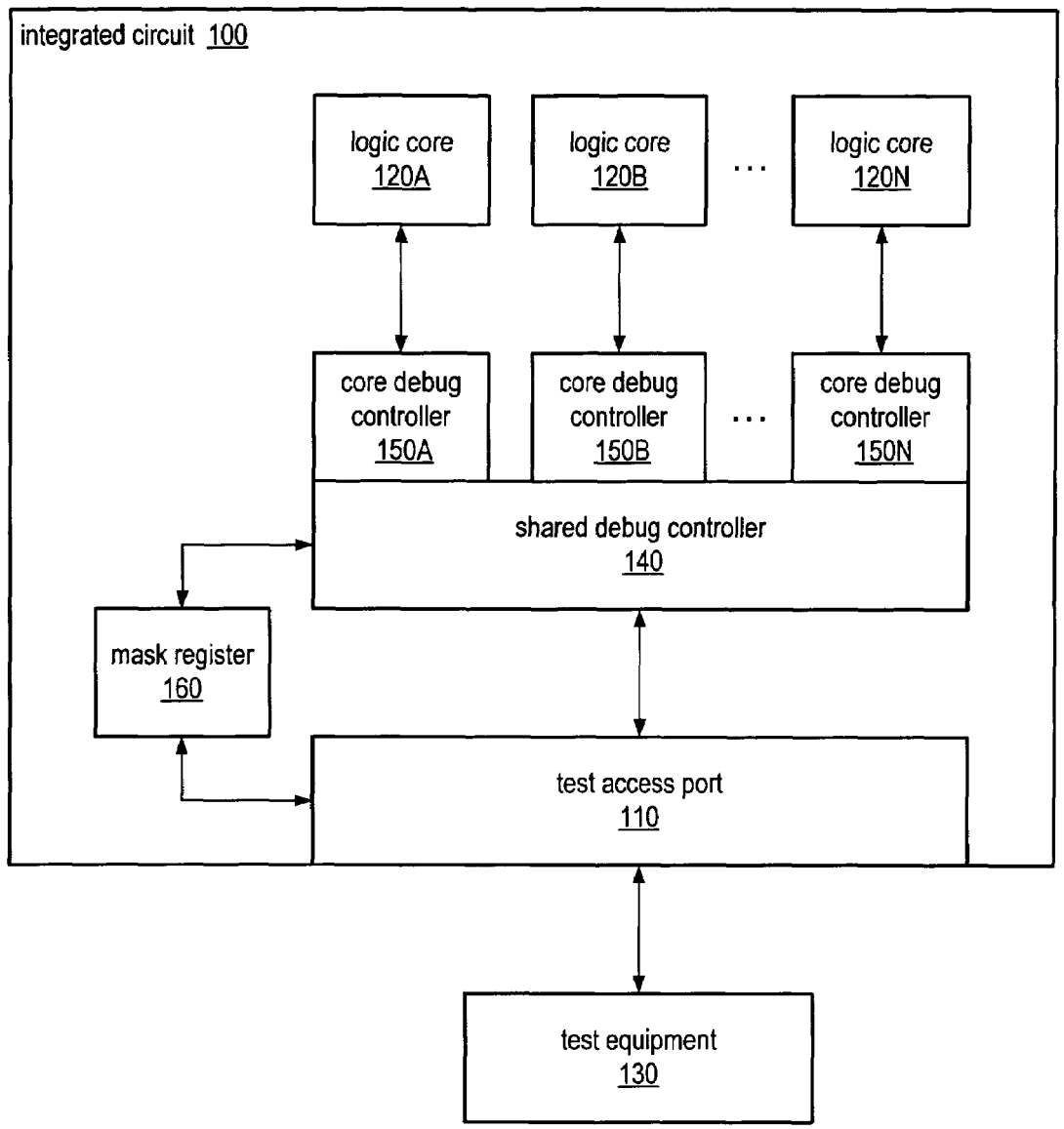
FIG. 1 is a block diagram illustrating one embodiment of a multi-core integrated circuit configured for debugging multiple logic cores via a single test access port.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include" and derivations thereof mean "including, but not limited to." The term "connected" means "directly or indirectly connected," and the term "coupled" means "directly or indirectly coupled."

DETAILED DESCRIPTION OF EMBODIMENTS

A single, shared debug port or test access port may be used to perform debug operations on multiple logic cores of a multi-core integrated circuit, according to some embodiments. For example, FIG. 1 is a block diagram illustrating a multi-core integrated circuit 100 that may include multiple logic cores 120. The exact number and configuration of logic cores 120 of multi-core integrated circuit 100 may vary from embodiment to embodiments. For example, in one embodiment, integrated circuit 100 may be a dual core processor, while in other embodiments integrated circuit 100 may include four or more logic cores. As illustrated in FIG. 1, a multi-core integrated circuit, such as integrated circuit 100 may include a single test/debug port, TAP, or other interface providing a testing/debugging interface from test equipment 130 to integrated circuit 100, such as test access port 110. For example, in some embodiments, test access port 110 may be JTAG-compliant or based upon a JTAG interface. In general, a JTAG-compliant test access port may be configured to perform various tests on part of an integrated circuit, such as performing continuity tests between various pins or signals of the integrated circuit. In other embodiments, test access port 110 may be a test access port or a proprietary or custom debug interface configured to allow debug operations to be performed on various components, such as logic cores 120A-120N of integrated circuit 100.

As described above, a single, shared debug port or TAP, such as test access port 110 may be used to perform debug operations on multiple logic cores, either individually or simultaneously. For instance, integrated circuit 100 may also include a debug controller configured to receive testing and/or debugging commands from test equipment 130 through the shared debug port and implement those commands for one or more logic cores, according to one embodiment. In some embodiments, integrated circuit 100 may include a shared debug controller 140 configured to interface with test access port 110 and to communicate with device and/or components external to integrated circuit 100 via test access port 110. Shared debug controller 140 and or core debug controllers 150 may, in some embodiments, be configured to place one or more logic cores 120 into a debugging or testing mode, referred herein as debug mode. In other embodiments, debug controller 140 and/or core debug controllers 150 maybe configured to request a logic core to disable its normal modes of operation and to enter a debug mode of operation. As used herein, debug mode refers a processing mode in which a logic core (or other circuitry) is executing, but is not loading and executing program instructions normally. Instead, a logic core in an debug mode, as described herein, may operate in a special testing or debugging mode in which OS or application program instructions are not being loading and executed, but in which special debugging commands may cause the logic core to read or write registers, cache arrays, memory or I/O interfaces. Thus, according to some embodiments, logic cores 120 may be configured to switch between a normal processing mode, such as one in which a logic core processes program instructions, and a debug mode, such as one in which a logic core performs debug commands received from a debug controller. In some embodiments, the two mode may be mutually exclusive such that when in debug mode the normal processing mode of a logic core is disabled.

According to various embodiments, test equipment 130 may represent test equipment external to integrated circuit 100, such as separate, stand-alone test equipment configured to communicate via test access port 110, such as according to the JTAG specification. Alternatively, test equipment 130 may represent test logic, circuitry, or other components on the same system as integrated circuit 100 and configured to provide debug functionality for logic cores of integrated circuit 100, in some embodiments. In certain embodiments, test equipment may represent test equipment traditionally used to debug the logic core of a single core integrated circuit, but configured, such as with customized software and/or firmware, to debug selected logic cores of multi-core integrated circuits, as described here.

In some embodiments, individual logic cores may be placed into debug mode while other logic cores of the same integrated circuit may continue executing normally. Thus, in some embodiments, logic core 120A may be placed into debug mode while logic core 120B may not. In some embodiments, the processing of individual logic cores may be interrupted in real time, or near real time and put into a debug mode for debugging or other testing.

Shared debug controller 140 may be configured to respond to commands received via test access port 110, according to some embodiments. In some embodiments, test access port 110 may be placed into a special debug pass-through mode in which commands and data received at test access port 110 are communicated or forwarded to shared debug controller 140. Thus, in some embodiments, a shared debug port, such as debug port 140 may be configured to recognize a particular command, such as a custom command, to enter a debug or other testing mode. After entering such a mode, a test access port 110 may be configured to forward all received data or commands to debug controller 140, according to some embodiments. For instance, in one embodiments, test access port 110 may be a JTAG-based debug port and may recognize a custom USEDEBUGMODE command and in response to receiving such a command may forward all received data and commands to shared debug controller 140, rather than interpreting any received data or command itself. Thus, in some embodiments, test access port 110 may be configured to switch between a normal mode of operation, in which received commands are interpreted by test access port 110, and a debug mode (such as initiated via a USEDEBUGMODE command), in which test access port 100 forwards received commands to debug controller 140. In some embodiments, the test/debug port may still monitor the data being communicated into the test/debug port in order to support another command to exit the debug pass-through mode, described below. In other embodiments, the debug controller may instruct the test/debug port when to exit such a mode and return to normal operation.

Please note that while the term USEDEBUGMODE is used herein to refer to a command that places a shared debug port into a debug mode, in other embodiments other methods and mechanisms may be utilized for causing a shared debug port, whether JTAG based or not, to forward communication to the debug controller. For example, according to some embodiments, while in a debug mode, such as may be initiated using a USEDEBUGMODE command, a JTAG-compliant test access port may not interpret received commands as JTAG commands, but instead may forward the received commands to the debug controller, as noted above. Thus, in some embodiments, a USEDEBUGMODE command may disable a normal operating mode for a test access port, such as test access port 110. Additionally, a debug controller, such as shared debug controller 140 or core debug controller 150, may be implemented in hardware (HW), micro-code, or a combination of both, according to various embodiments.

While FIG. 1 illustrates common debug controller 140 as separate from test access port 110, in some embodiments, some or all of debug controller 140 may be included as part of test access port 110. Thus, in some embodiments, integrated circuit 100 may include a shared debug port that includes a debug controller for coordinating and controlling the testing and debugging of multiple logic cores 120. As described, integrated circuit 100 may include individual sets of core debug controller 150 configured to receive testing commands, such as debug commands, from (or via) shared debug controller 140, even in embodiments where shared debug controller 140 may be a part of test access port 110. In some embodiments, shared debug controller 140 may receive and interpret testing and/or debugging commands via test access port 110 and may then send appropriate commands to a logic core via core specific debug controller 150. In response to receiving testing commands, a particular core debug controller 150 may be configured to implement those commands on a corresponding logic core 120 of multi-core integrated circuit 100.

When debugging more than one logic core at a time, various methods of determining for which logic core (or cores) a particular debug command is meant may be utilized. For example, in one embodiment, integrated circuit 100 may also include a mask register, such as mask register 160, used to select specific logic cores for debugging. For instance, each bit of such a mask or target register may correspond to a particular logic core and thus a value stored in such a mask register may indicate one or more logic cores, according to some embodiments. Thus, according to one embodiment, a value indicating (or selecting) more than one logic core may be stored in mask register 160 and when instructed to place logic cores into debug mode, debug controller 140 may use the value stored in mask register 160 to determine which individual logic cores should be placed into debug mode. In some embodiments, values may be written to and/or read from mask register 160 directly via the debug port, while in other embodiments, the mask register 160 may only be written to or read from via debug controller 140 while test access port 110 is in a debug or other pass-through mode.

Thus, in some embodiments, in order to perform debug operations on one or more logic cores 120 of a multi-core integrated circuit 100, a test engineer may communicate with integrated circuit 100 via an external host or test device configured to communicate with test access port 110, such as according to a JTAG-based interface. The test engineer may first issue a command to place test access port 110 into a debug or pass-through mode in which test access port 110 does not evaluate received data and/or command normally, but instead communicates received data and/or commands to debug controller 140. A test engineer may then write a value to mask register 160 to indicate which logic cores to test/debug, according to some embodiments. The test engineer may then issue a command, such as be asserting a DBREQ line, instructing debug controller 140 to put the logic core indicated by mask register 160 into debug or debug mode. Subsequently, the test engineer may issue commands to read or write registers, cache arrays, I/O interfaces, etc. to perform various testing/debugging operations with the logic cores. In some embodiments, each debug command issued may include a command field indicating for which logic cores the command is intended. In some embodiments, a mask register, such as mask register 160 may be used to indicate for which logic cores an individual debug command is intended. As noted above, in some embodiment, common, shared debug controller, such as debug controller 140 may be configured to receive and interpret debugging commands and utilize a value, either in the command itself, or stored in mask register 160, to implement each command for selected logic cores.

Additionally, according to some embodiments, existing or traditional test equipment, port interfaces, and/or communications protocols for testing/debugging single core integrated circuits may be utilized to test/debug selected logic cores of a multi-core integrated circuit. For example, by utilizing a mask register or other means to select individual logic core traditional test equipment, such as a cable linking a test access port to an external test device, may be used with the present invention to allow debugging of selected cores of a multi-core integrated circuit, in one embodiment. However, in some embodiments, the software or firmware logic of existing test equipment may have to be modified to support the selecting of individual logic cores for particular debug operations.

While FIG. 1 illustrates a single test access port connecting to multiple logic cores of a multi-core integrated circuit, in some embodiments, a multi-core integrated circuit may include more than 1 test access port. For instance, a multi-core integrated circuit may include 4 logic cores and two test access ports. For example, one test access port may be configured to allow debugging of two of the four logic circuit, while the other test access port may be configured to allow debugging of the other two logic cores. In some embodiments, which logic cores are debugged via which test access port may be fixed by the circuitry of the integrated circuit. In other embodiments however, the integrated circuit may allow run-time configuration to determine which logic cores are debugged via which test access port. For example, each test access port may have an associated mask register that indicates which logic cores the corresponding test access port should communicate with for debugging. Such an integrated circuit may also include two mask registers for selected particular logic cores for debugging.

Figure 2:
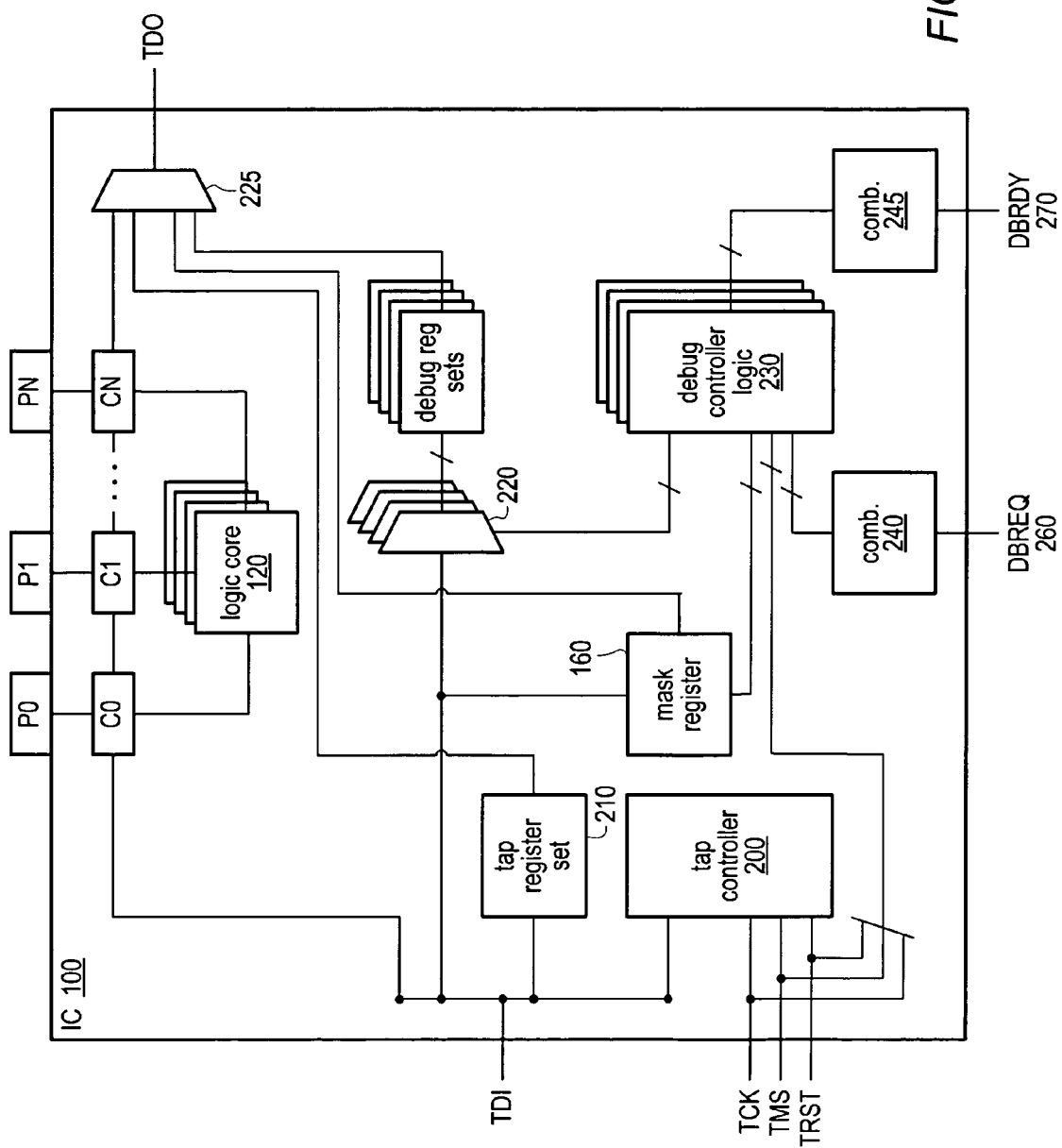
FIG. 2 is a diagram illustrating one embodiment of logic circuitry for a multi-core integrated including a test access port.

FIG. 2 illustrates the general structure of an exemplary test port/debug interface, according to one embodiment. For example, in some embodiments such a port may be compliant with the IEEE standard number 1149 "Standard Test Access Port and Boundary-Scan Architecture", which was written by the Joint Test Action Group (JTAG) and the architecture defined by it is also referred to as "JTAG boundary scan". IEEE standard 1149 defines a 5-pin serial protocol for accessing and controlling the signal-levels on the pins of a digital circuit, and includes extensions for testing the internal circuitry on the chip itself. As noted above, in some embodiments, a shared debug port, such as test access port 110 in FIG. 1, may be configured to implement a JTAG based interface and may additionally be configured to recognize debug related commands, such as a USEDEBUGMODE command described above.

The JTAG interface, as it is commonly referred to, generally uses five dedicated signals. For example, the example interface illustrated in FIG. 2 includes TRST, TCK, TMS, TDI and TDO signals, according to some embodiments. TRST may represent a Test-ReSeT input that may initialize and/or disables the test interface. TCK may be a Test ClocK input, controlling the timing of the test interface independently from any system clocks. In some embodiments, TCK may be supplied by the equipment controlling the test rather than the tested device. TCK may be configured to be pulsed at frequencies up to a maximum number of MHz, and may be configured to be pulsed at varying rates. TMS may be a Test Mode Select input, which controls the transitions of a test interface state machine or of a test access port (TAP) controller. TDI may be a Test Data Input line, supplying data to the JTAG registers (e.g. Boundary Scan Register, Instruction Register, and/or other data registers). TDO may be a Test Data Output line used to serially output the data from the JTAG registers to the equipment controlling the test in some embodiments. TDO may also be configured to convey sampled values from the boundary scan chain (or other JTAG registers to the next chip in the serial test circuit under some configurations.

The signals between a chip's logic core and the pins of the IC are intercepted by a serial scan path known as the "Boundary Scan Register" (BSR), and shown as cells "C0" through "CN" in FIG. 2. During normal system operation this path may connect the core-logic signals to IC pins and may effectively be transparent to the logic cores and to any device reading data from external to the integrated circuit. In some embodiments, a TAP controller, such as TAP controller 200 may be configured to disconnect the core-logic from the pins, drive the output pins itself, and read and latch the states of the input pins, such as in an external-test mode. Similarly, in some embodiments, such as in an internal-test mode, TAP controller 200 may be configured to disconnect one or more logic cores logic from the chip pins, drive the core-logic input signals, and read and latch the states of the core-logic output signals. Thus, in debug or test modes, TAP controller 200 may be utilized to communicate with and control debug controller for testing and/or debugging.

The operation of the test interface may be controlled by the TAP controller, which may be a state-machine whose transitions are controlled by the TMS signal, according to some embodiments. For example, in some embodiments, one state path in the state machine may control the operations on data registers (such as, ID register, Bypass register, BSR register, etc.) and another may control the operations of the instruction register. The two paths may be known as the DR (data register) path and the IR (instruction register) path respectively. The particular data register operated upon when the DR path is taken may be selected based on a value loaded into the instruction register, according to one embodiment. During an IR path execution, the new value may be shifted into the instruction register from the TDI line upon the entries to the 'shift ir' state. The old value of the instruction register may be shifted-out the TDO line upon the exits from the "shift ir" state. The value of the instruction register shifted out may be "captured" upon entry to a "capture ir" state while the new value shifted into the Instruction Register is applied (and takes effect) upon the entry into the "update ir" state.

A DR path execution may be used to load a new value into the currently selected data register, and read the previous value back, according to some embodiments. The new value may be shifted into the currently selected data register from the TDI line upon the entries to the 'shift dr' state while the previous value of the currently selected data register is shifted out to the TDO line upon the exits from the "shift dr" state. The value of the currently selected data register that will be shifted out may be "captured" upon the entry to the "capture dr" state and the value of the currently selected data register is applied (e.g. transferred to the output pins, in case of the BSR) upon entry into the "update dr" state.

As mentioned above, an instruction register may be used to select among various data registers to be operated upon during a "dr path" execution. Most IEEE 1149-compliant JTAG implementations, such a test access port 110 in some embodiments, may include, but may not be limited to, the following data registers: a Device ID register (IDR), which reads-out a hardwired identification number, a Bypass register (BR), which may be a 1-cell pass-through register that connects the TDI to the TDO with a 1-clock delay to give test equipment easy access to another device in the test chain on the same board, and a Boundary Scan register (BSR), which may intercept signals between the core-logic and the pins. These data registers may be used in the execution of public instructions by a JTAG TAP controller, such as tap controller 200. Additional registers may also be present in the design to perform other test operations under the control of private instructions as provided for in the IEEE 1149 standard.

For example, the public instructions may include a USEDEBUGMODE command to cause the JTAG TAP controller and associated circuitry to be configured as a pass-through to an embedded hardware debug tool set or debug controller. One or more DBREQ signals may be used to place some subset of the debug controllers associated with the logic cores of a multi-core integrated circuit into an test or debug mode. In some embodiments, a DBREQ signal may cause the debug controller to interrupt the processing of the selected logic core, thus allowing real time debug operation. In one embodiment, each debug controller may function in a manner analogous to the JTAG TAP controller in that it may have an associated instruction/command register and a set of data registers. As in the case of the JTAG TAP controller, these registers may be written with data from test equipment using a TCK signal to clock the data into the registers on the TDI line, bypassing the TAP controller and associated registers.

Figure 3:
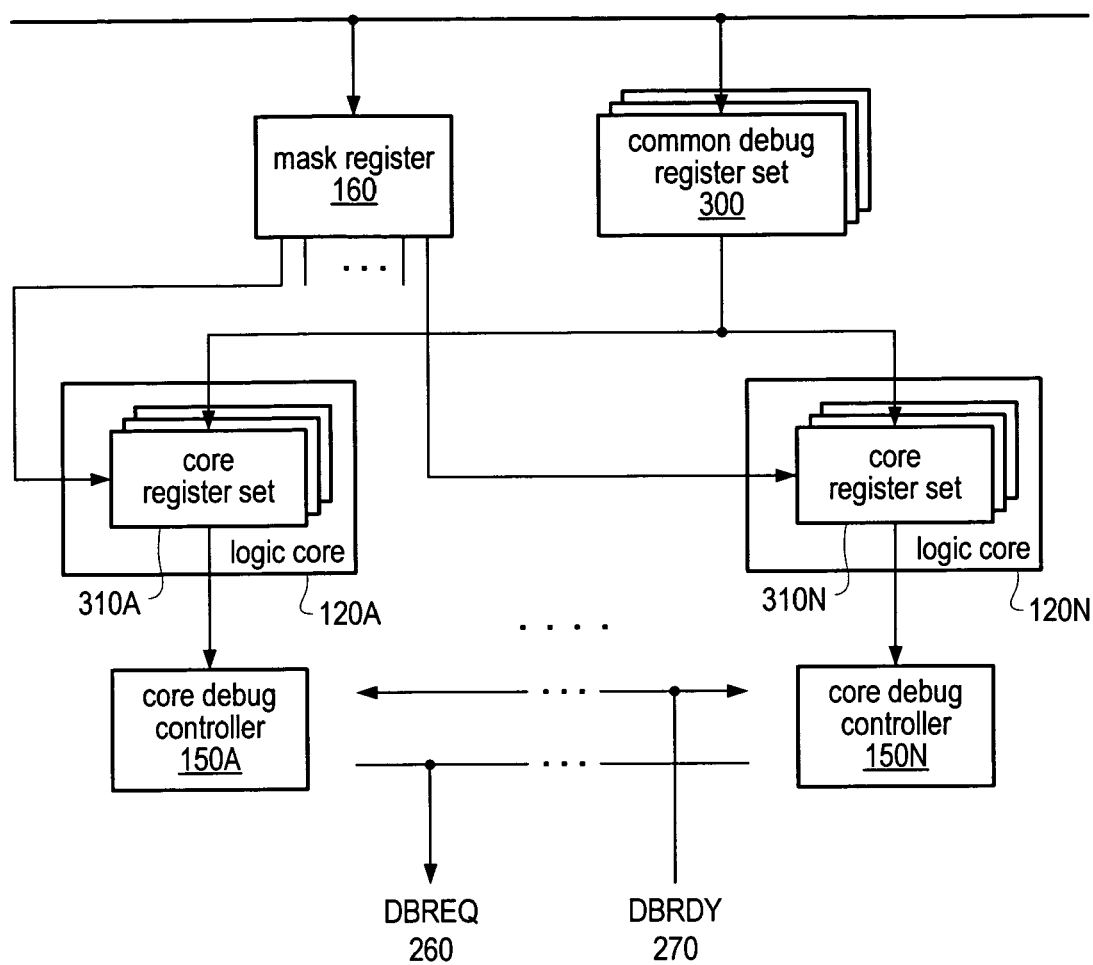
FIG. 3 is a block diagram illustrating an exemplary debug controller in a multi-core integrated circuit, according to one embodiment.

FIG. 3 illustrates one exemplary implementation of debug control logic included in a multi-core IC, according to one embodiment. For example, FIG. 3 may represent components and circuitry included in multi-core integrated circuit 100, according to one embodiment. As noted above, integrated circuit 100 may include debug controller 140 configured to control testing and debugging of one or more logic cores 120 via commands received over a shared test access port 110. The TAP signals described above regarding FIG. 2 may be connected to a general set of debug registers 300 that are common to all processor cores included in the IC. Some subset of these registers may in turn be connected to corresponding registers dedicated to each individual processor core, such as core register set 310A through 310N. For example, common debug register set 300 may include registers analogous to those described above with regard to the TAP controller such as an instruction or command register along with one or more data registers. The register set may be replicated in debug hardware specific to each processor core, such as debug controller logic 150A through 150N. A command register associated with a particular processor core may receive instruction data from a corresponding common register based on the state of a bit included in the mark register 160. This data may be interpreted by debug controller 150 associated with the processor core as commands to perform such testing or debugging functions as reading a value from a particular register, writing a value to a particular register or exiting from test mode. An exemplary set of commands and their encoding is described below.

The mask register 160 may be an element of the register set common to all processor cores included in an integrated circuit, such as integrated circuit 100, according to one embodiment. Values may be written into this register as with the other common registers by placing data on a TDI line of a debug port interface and clocking it in serially using the TCK signal, according to some embodiments. In one embodiment, a bit in the mask register 160 may correspond to a particular logic core 120 of a multi-core integrated circuit. Output from a particular bit of the core target register may be used to enable a core register set 310 of the corresponding core, according to one embodiment. Multiple register sets corresponding to multiple logic cores may be enabled simultaneously to allow the broadcast of command and data register values to more than one processor core by setting the appropriate bits in mask register 160, according to one embodiment. As noted above, in some embodiments, debug or test commands received by the debug controller of an integrated circuit may include as mask or core target field as part of the command that specified, selects or otherwise indicates to which logic cores the particular command applies. Being able to individually specify more than one logic core during debugging or testing may allow for the simultaneous testing of various combinations of cores included in the IC.

In some embodiments, debug controller associated with a particular logic core included in a multi-core integrated circuit may function analogously to the TAP controller as described previously. An instruction loaded into the command register may specify a particular data register to be used during the execution of the specified operation. The debug controller may comprise a state machine whose state transitions are controlled by one or more of the TAP signals. As described previously, the TAP controller may respond to a USEDEBUGMODE command by entering a pass-through mode and relinquishes control of the TAP to debug controller. A DBREQ signal 260 may be used to initialize debug controller and couple it to the TAP signals. Since only one DBREQ pin may be included in a multi-core IC, the value stored in mask register 160 may be accessed by debug controller in order to determine which logic cores 120 and which core debug controller 150 to initialize into debug or another debug/test mode. For example, in one embodiment, the output of each bit of the core target register may be ANDed with the incoming DBREQ signal 260 before being coupled to the corresponding core test circuitry, according to one embodiment.

In response to an asserted DBREQ signal 260, core debug controller 150 of logic cores selected via mask register 160 may be reset and initialized or otherwise put into an debug or other test/debug mode. Subsequently core debug controller 150 may respond to commands issued by the ATE, such as via the TAP interface, to write values into certain registers, execute tests, read values from certain processor core registers, exit from test mode, and/or perform other testing or debugging functions. In one embodiment, core debug controller 150 may assert a DBRDY signal to indicate that it has successfully entered test mode and is ready to communicate with the ATE through the TAP. When DBREQ 260 is asserted for more than one logic core simultaneously, such as by storing a value indicating multiple logic cores in mask register 160, a DBRDY line from each of the selected logic cores 120 may be directed to combinational logic such that the DBRDY output 720 of the integrated circuit is only asserted when the DBRDY lines of all selected debug controllers have been asserted. In other embodiments, an integrated circuit may not include multiple DBRDY lines from individual logic cores 120 or from individual core debug controller 150, but instead a particular register in each logic core 120 or associated with each core debug controller 150 may be used to indicate when a particular logic core and/or core debug controller has entered an debug or other test/debug mode.

As noted above, a logic core may encounter a break point instruction during execution causing the logic core to enter a debug or other debugging mode, according to some embodiments. Rather than loading or switching to a software debugger upon encountering a breakpoint instruction, the logic cores of a multi-core integrated circuit may be configured to enter a debug mode. While in debug mode, core debug controller 150 may assert its DBRDY line, or store a value to a particular register, to indicate that an associated logic core 102 has reached a pre-selected break point during program execution. In some embodiments, the logic associated with an IC's DBRDY output 270 may be programmable such that the main DBRDY signal 270 may be asserted in response to a wide variety of combinations of debug controllers and associated individual logic cores entering debug mode. For example, when an individual logic core 120 and its associated core debug controller 150 enters debug mode, the core debug controller 150 may assert an internal DBRDY signal (or may store a particular value to a register, or otherwise indicate that the logic core and debug controller are in debug mode) and common or shared debug controller 140 may wait until all logic cores indicated by mask register 160 have entered debug mode before asserting an DBRDY signal 270 externally.

When it is desired to have one or more logic cores and associated core debug controller exit from debug mode, the ATE may issue an exit debug mode command with the appropriate cores designated in the mask register 160. As when causing logic core and core debug controller to enter debug mode, the use of mask register 160, the use of a special field in an exit debug mode command, either a single or multiple logic cores may be instructed to exit debug mode. In some embodiments, debug controller 140 of an integrated circuit may de-assert a DBRDY signal 270 to indicate that one or more logic cores 140 have exited debug mode. In one embodiment, DBRDY signal 270 may be de-asserted only after all logic cores have exited debug mode. Thus, in some embodiments, DBRDY signal 270 may remain asserted as long as even a single logic core 120 remains in debug mode. Additionally, debug controller 140 may be configured to return a response to a EXITDEBUGMODE command indicating which logic cores 120 successfully exiting debug mode. Thus, in some embodiments, DBRDY signal 270 may be asserted as soon as a first logic core 120 entered debug mode and may remain asserted until a last logic core exits debug mode. In other embodiments, however, DBRDY may be asserted only after all the indicated logic cores 120 have entered debug mode. The particular manner and algorithm used to determine when a DBRDY signal 270 should be asserted and de-asserted may vary from embodiment to embodiment.

As noted above, debug controller, such as debug controller 140, may be configured to receive, interpret and implement, various testing and debugging commands communicated via a shared debug port, such as test access port 110. When debugging more than one logic core of a multi-core integrated circuit, a mask register may be used to indicate for which logic cores a particular command is intended. Additionally, each command of a debug or other test/debug command set may include a field to indicate for which logic core the command in intended. As with the value of a mask register 160, the value of a mask or core target field in a command may include multiple bits, each corresponding to a different logic core 120. For instance, command may include a two-bit command field and may also include a set of bits to designate which logic cores the particular command should be executed for. For example, a write command may indicate more than one logic core in its mask field and may cause the debug controller to write a particular value to each indicated logic core. Similarly, if the value of a command field indicates a read instruction, such as '00', the debug controller may perform a read instruction on an element of a logic core indicated by the mask field of the read command. However, it may not make sense to attempt read values from more than one logic core simultaneously and so a read command may not include a mask or other core selection field or only a single logic core may selected via a core mask field of a read command. Thus, certain debug commands may be configured for execution on multiple logic cores simultaneously, such as entering debug mode or writing a value to a register, while other debug commands may only be performed on a single logic core, such as a read command.

In some embodiments, the particular register from which a value is to be read may be indicated by the value in another field of the debug controller instruction. An '01' value in the command field may indicate that the selected debug controllers are to perform a write operation to a specified register. As with the read command, the particular register to which a value is to be written may be indicated by a value in another field of the debug controller instruction. To cause one or more of the debug controllers associated with corresponding processor cores to exit testing mode, a value of '10' may be stored in the command field of the instruction register. The specific debug controllers that are to exit test mode in response to the command may be indicated by the value stored in the core target register or field, in some embodiments.

The mask or other core selection field of an debug command may include N bits, where N is the number of logic cores included in the IC. In some embodiments, each bit of the core mask field may correspond to a particular logic core. For instance, to enable a particular logic core's associated test hardware, a '1' may be stored in the core target register bit associated with that core. For the write and exit commands described above, any subset of logic cores may be selected by the core mask field. Specifically how debug controller 140 determines and implements debug commands on multiple logic cores may vary from embodiment to embodiment. For instance, data input on a TAP TDI line may be broadcast to each core debug controller associated with a logic core whose corresponding bit is set in the core mask register. On the other hand, since the TAP may include only a single line for outputting response data, e.g. TDO, only one logic core may be targeted by a certain commands, such as a read command, and therefore only one bit may be set in the core mask register for such operations.

While discussions above regarding debug command refer to specific names and sizes of command fields according to some embodiments, other embodiments, may utilize differently sized or named command fields. In general, any suitable protocol and command format may be utilized when testing or debugging multiple logic cores of a multi-core integrated circuit via a single, shared debug port, according to various embodiments.

Figure 4:
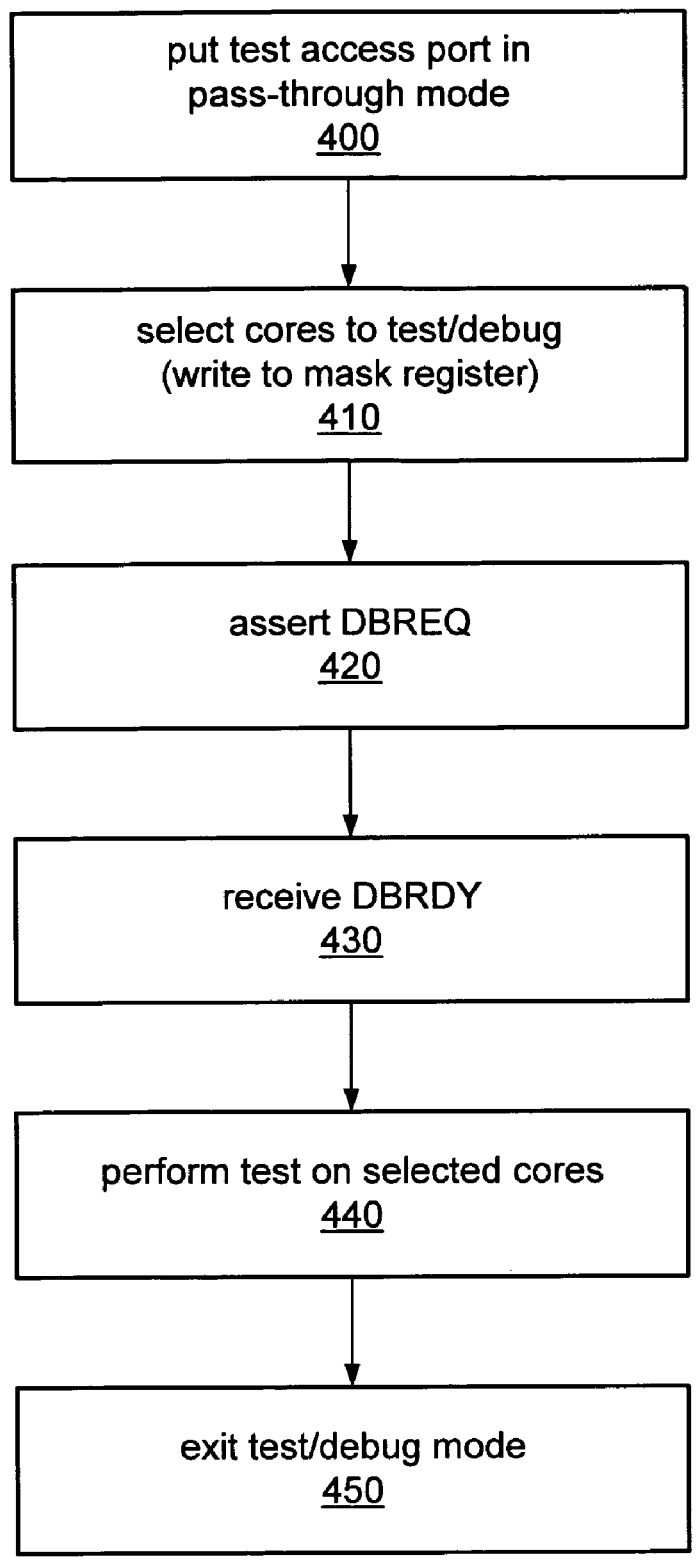
FIG. 4 is a flowchart illustrating one embodiment of a method for debugging multiple logic cores via a shared test access port.

FIG. 4 is a flowchart for selectively providing test data to the logic cores of a multi-core IC through a shared debug port, such as a shared JTAG port, according to one embodiment. At 400, the ATE may put a shared debug port into a pass-through or debug mode. For example, in one embodiment, an ATE may issue a USEDEBUGMODE command to a TAP controller associated with a shared debug port. A USEDEBUGMODE command may place the TAP controller in a pass-through or transparent mode in which it sends or forwards all data and/or command to debug controller on the integrated circuit. As shown in block 410, the ATE may select one or more logic cores, such as logic cores 120, to test/debug and thus to put into debug mode. In one embodiment, as described above, a particular value may be stored in a core mask register in which each bit represents a different logic core. For example, an ATE may write data through the TAP into the core mask register 160 to select the logic cores whose test hardware is to be activated or which otherwise should be put into a debug or test mode. As noted above, a core mask register 160 for a multi-core integrated circuit including N logic cores 120 may include N bits, each associated with a corresponding core. The ATE may shift an N-bit value into the mask register 160 in which a "1" is present in each register bit corresponding to a processor core to be transitioned into debug mode. In other embodiments, other methods of selecting or indicating logic cores may be utilized.

After selecting or indicating those logic cores to test/debug, the ATE may assert the DBREQ signal 260, such as to an appropriate pin of integrated circuit 100. In response to an asserted DBREQ signal 260, debug controller 140 of integrated circuit 100 may put the selected or indicated logic cores 120 into debug mode. For example, from the DBREQ IC pin, the DBREQ signal may be routed to combinational/programmable logic that may mask the signal from core debug controller 150 associated with logic cores not selected by entries in the mask register 160, while routing the signal to core debug controller 150 associated with logic cores that are selected by mask register 160. As noted above a DBREQ signal may be transmitted to selected core debug controller to cause them to be reset and begin transitioning their associated logic cores into debug test mode. In other embodiments, rather than routing a DBREQ signal to individual core debug controller 150, in response to an asserted DBREQ signal 260 debug controller 140 common to or shared among all the logic cores 120 of integrated circuit 100 may be configured to individually instruct the appropriate core debug controller 150 in order to put those logic cores indicated by mask register 160 into debug mode.

When particular core debug controller 150 and associated logic core 120 are in debug mode or are otherwise prepared to perform testing/debugging, the core debug controller 150 may assert its DBRDY signal. As stated previously, in some embodiments the DBRDY signals from individual core debug controller 150 may be routed to combinational/programmable circuitry and the output of this circuitry routed to the chip DBRDY pin. In some embodiments, such combinational/programmable circuitry may be included as part of common debug controller 140. When responding to a DBREQ signal 260, a DBRDY signal 270 from the IC may be asserted only after DBRDY signals have been received corresponding to all selected logic cores. When all the selected logic cores have entered debug mode, a DBRDY signal 270 may be asserted externally from the integrated circuit. For instance, in one embodiment, receipt of the IC DBRDY signal by the ATE may indicate that the debug controllers associated with the selected processor cores are attached to the TAP, have gained control of the cores, and are ready to accept test commands and data.

After the DBRDY signal 270 has been asserted, as illustrated by block 430, indicating that the selected logic cores are in debug mode, the ATE may send one or more debug (or test) commands to selected logic cores in order to perform testing on selected cores, as indicated by block 440. As noted above, individual logic core may be selected for a particular logic core using mask register 160, or alternatively, by including such a selection in a mask or core selection field of the command itself. In some embodiments, debug commands may be distributed internal to the IC to the core debug controller 150 associated with processor cores selected by the core target register. In response to write commands, selected core debug controller may select one or more registers included in their respective register sets or registers within the processor cores to receive test or command data.

After performing testing or debugging on the selected logic cores, the ATE may then exit debug mode, as indicated by block 450. In some embodiments, an ATE may request that all selected logic cores exit debug mode and resume normally processing by de-asserting the DBRDY signal 260. In other embodiments, a specific EXITDEBUGMODE command may be issued via the shared debug port. For instance, in one embodiment the ATE may issue a particular command, such as an EXITDEBUGMODE command, instructing debug controller on the integrated circuit to exit debug mode and resume normal processing. In response to such a command, debug controller 140 may be configured to instruct core debug controller associated with each selected logic core, such as indicated by mask register 160, to exit debug mode and resume normal processing. In some embodiments, the DBRDY signal 270 may be de-asserted to indicate that one or more of the selected logic cores has exited debug mode. For example, in one embodiment, DBRDY signal 270 may be de-asserted as soon as the first one of the selected logic cores exits debug mode. In other embodiments, however, DBRDY signal 270 may not be de-asserted until all the selected logic cores have exited debug mode and resumed normal processing. As each core debug controller 150 successfully causes its associated logic core to exit from test or debug mode, it may de-assert an internal DBRDY signal. DBRDY signals from the core debug controller may be routed to combinational/programmable logic whose output may be routed to the DBRDY signal 270 of the IC. In one embodiment, the combinational logic may de-assert the IC DBRDY signal 270 in response to any of the selected cores' debug controller de-asserting its respective internal DBRDY line. In another embodiment, the combinational logic may de-assert the IC DBRDY signal 270 only after all of the selected cores' debug controller have de-asserted their respective internal DBRDY line.

In some embodiments, an individual EXITDEBUGMODE command may be used to request that a single logic cores exit debug mode and resume normal processing without affecting other logic cores that may remain in debug mode for further testing or debugging. For example, the EXITDEBUGMODE command may include a core mask or core select field indicating which logic core(s) should exit debug mode and resume normal processing. In other embodiments, mask register 160 may be updated to indicate which logic core should exit debug mode.

Figure 5:
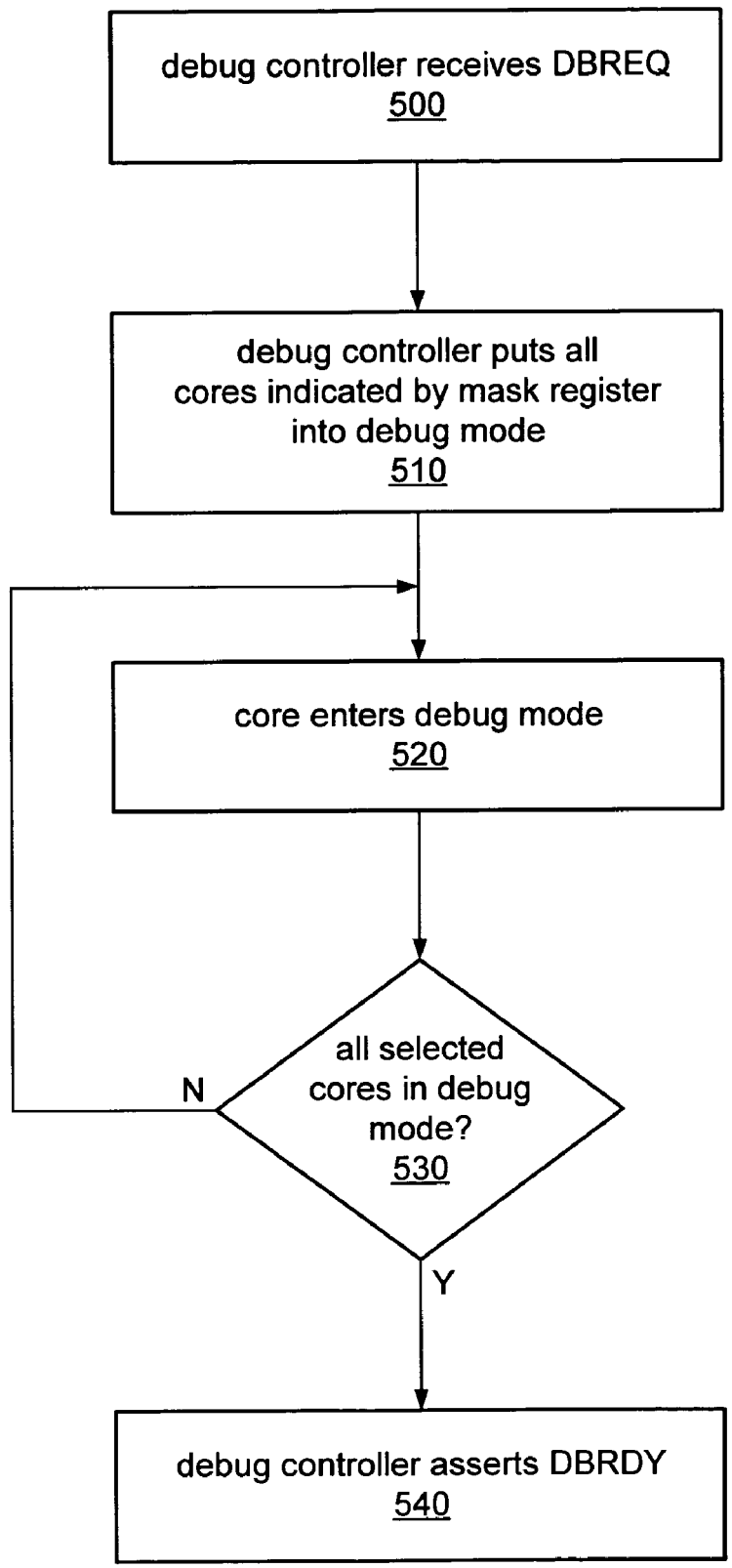
FIG. 5 is a flowchart illustrating one embodiment of a method for externally initiating testing/debugging multiple logic cores via a shared test access port.

FIG. 5 is a flowchart illustrating one embodiment of a method for externally initiating testing or debugging of logic cores in a multi-core integrated circuit. As noted above, in some embodiments, a single, shared debug port, such as test access port 110 may be utilized to test or debug one or more logic 120 cores of a multi-core integrated circuit 100. As indicated by block 500 of FIG. 5, debug controller 140 of a multi-core integrated circuit 100 may detect that a DBREQ signal 260 has been asserted from outside the integrated circuit 100. For example, DBREQ signal 260 may be connected to an external host device or ATE to allow external testing and/or debugging of one or more logic cores 120. An external testing or debugging system may be configured to assert DBREQ signal 260, such as in response to user input requesting the testing and/or debugging of one or more of the logic cores in a multi-core integrated circuit. In other embodiments, a system including a multi-core integrated circuit may include components external to the integrated circuit that may be configured to assert a DBREQ signal 260 to allow testing of the logic cores in the integrate circuit. While DBREQ is described herein mainly in reference to a single pin or line, in some embodiments, other methods of requesting debug controller logic to enter a debugging or testing mode may be used. For example, in one embodiments, asserting a combination of two or more lines, or storing a particular value to a register may have the same effect as described herein regarding asserting a DBREQ line.

After detecting that DBREQ was asserted, debug controller 140 may be configured to put those cores selected or indicated by mask register 160 into debug mode or another testing or debugging mode, as indicated by block 510. For instance, an integrated circuit 100 may include individual core debug controller 150 associated with each logic core 120 that may be configured to initiate a debug mode for the associated logic cores. In response to an asserted DBREQ signal 270, common or shared debug controller 140 may be configured to instruct individual core debug controller 150 to put one or more associated logic cores 120 into debug mode. In one embodiment, internal DBREQ lines or signals may be routed to individual core debug controller 150, while in other embodiments other lines, signals, or commands may be used to instruct individual core debug controller to put respective logic cores 120 into debug mode. As an individual logic core 120 enters debug mode, the core debug controller 150 associated with that logic core may be configured to inform common or shared debug controller 140. For example, internal DBRDY lines or signals may be used to signal when individual logic core have entered debug mode, according to some embodiments. In other embodiments, other lines, signals, registers or other mechanisms may be used to indicate to common debug controller 140 that a particular logic core 120 has entered debug mode, as indicated by block 520.

As noted above, common debug controller 140 may wait until all selected logic cores have entered debug mode before indicating a response to an asserted DBREQ signal 270. Thus, as indicated by decision block 430, common debug controller 140 may determine whether all selected logic cores have entered debug mode. If not, common debug controller may wait to receive a signal or other indication that the remaining selected logic cores have entered debug mode. If, as indicated by the positive output from decision block 530, all the selected logic cores 120 of integrated circuit 100 have entered debug mode, common debug controller 140 may assert DBRDY signal 270 as an indication that all selected logic cores have entered debug mode and are ready for testing and/or debugging.

Figure 6:
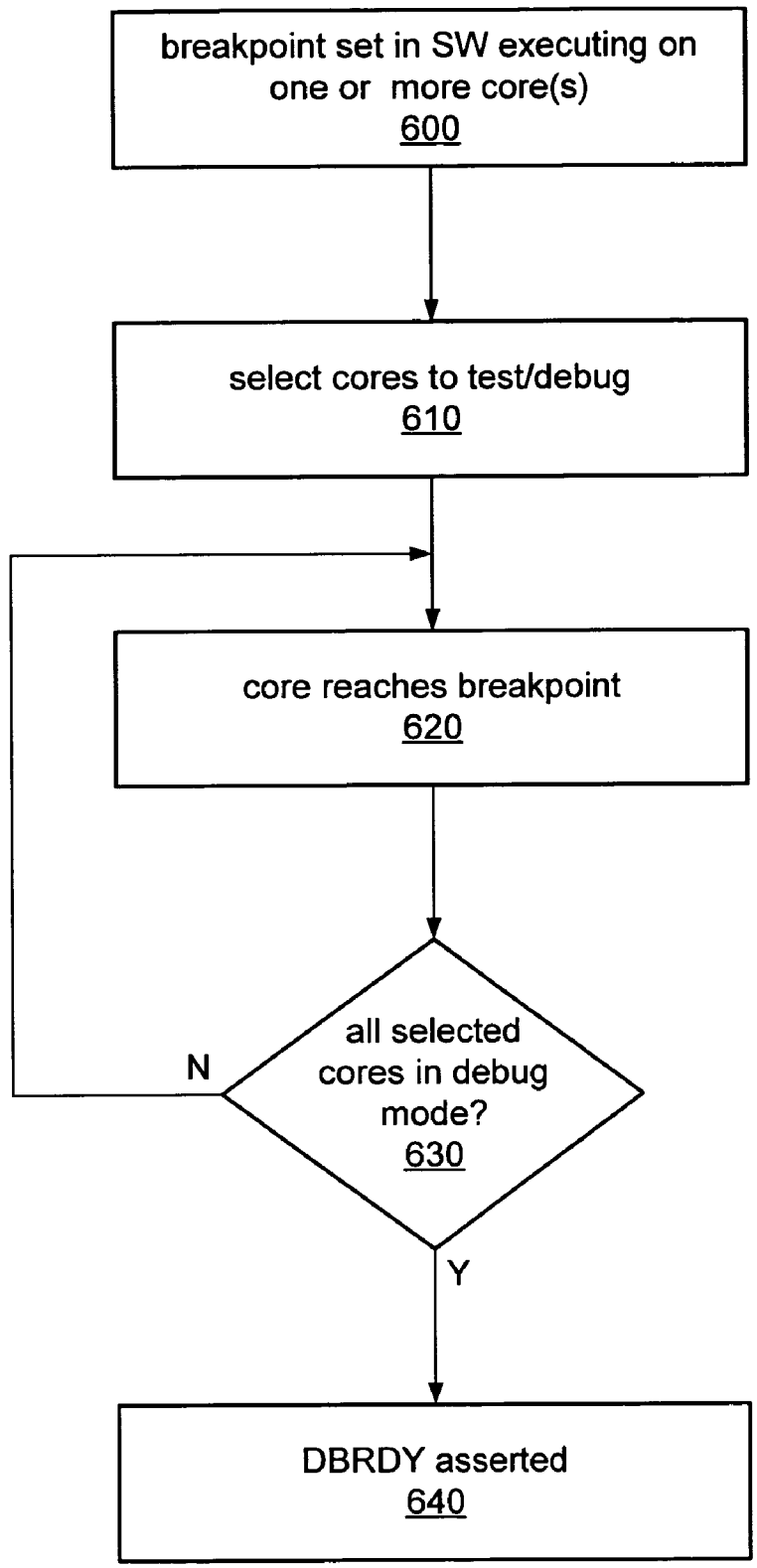
FIG. 6 is a flowchart illustrating one embodiment of a method for internally initiating testing/debugging multiple logic cores via a shared test access port.

While FIG. 5 illustrated one embodiment of a method for externally initiating testing or debugging of logic cores, FIG. 6 is a flowchart illustrating one embodiment of a method for internally initiating testing or debugging of one or more logic cores of a multi-core integrated circuit. As noted above, a individual logic core 120 of a multi-core integrated circuit 100 may be configured to enter debug mode upon encountering a breakpoint instruction during normal processing. In some embodiments, certain registers or other components of the logic cores 120 of integrated circuit 100 may be configured to automatically initiate debug mode when a breakpoint is met instead of handing control over to a software debugger. Thus, to utilize internally initiated debugging of logic cores via a shared debug port, as described herein, one or more breakpoint instructions may be set in software program instructions executing on one or more logic cores, as indicated by block 600. In some embodiments, such instructions may be included in the source code being executed by a logic core. In other embodiments, however, internal breakpoint functionality of the logic core may be utilized to create a conditional breakpoint. Thus, different types of breakpoints may be configured in various ways in order to cause a logic core to enter debug mode, according to various embodiments. As various and numerous methods of creating and setting breakpoints are well understood in the art, they will not be discussed in detail herein.

In order to determine when all the logic cores to be tested or debugged have encountered their respective breakpoint and thus entered debug mode, a value indicating the selected logic cores may be written to mask register 160, as indicated by block 610. Storing a value in mask register 160 that indicates which logic cores are expected to enter debug mode may allow common debug controller 150 to properly inform or signal an ATE or other external testing components when all the selected logic cores are in debug mode, as described below. When a logic core encounters a breakpoint, as indicated by block 620, its associated core debug controller 150 may be configured to put the logic core into debug mode for debugging and may also be configured to inform common debug controller, such as be asserting an internal DBRDY line or storing a value to a particular register, that its associated logic core has successfully entered debug mode. In other embodiments, a logic core may be configured to automatically enter debug mode upon encountering a breakpoint and the logic core's associated core debug controller 150 may be configured to detect that the core has entered debug mode and inform common debug controller 140. After all selected logic cores, as indicated by mask register 160, have encountered a breakpoint and successfully entered debug mode, as indicated by the positive output of block 630, common debug controller 140 may assert DBRDY signal 270, as indicated by block 640. As noted above, in other embodiments, common debug controller 140 may be configured to assert a DBRDY signal 160 only after all selected logic cores have entered debug mode.

Figure 7:
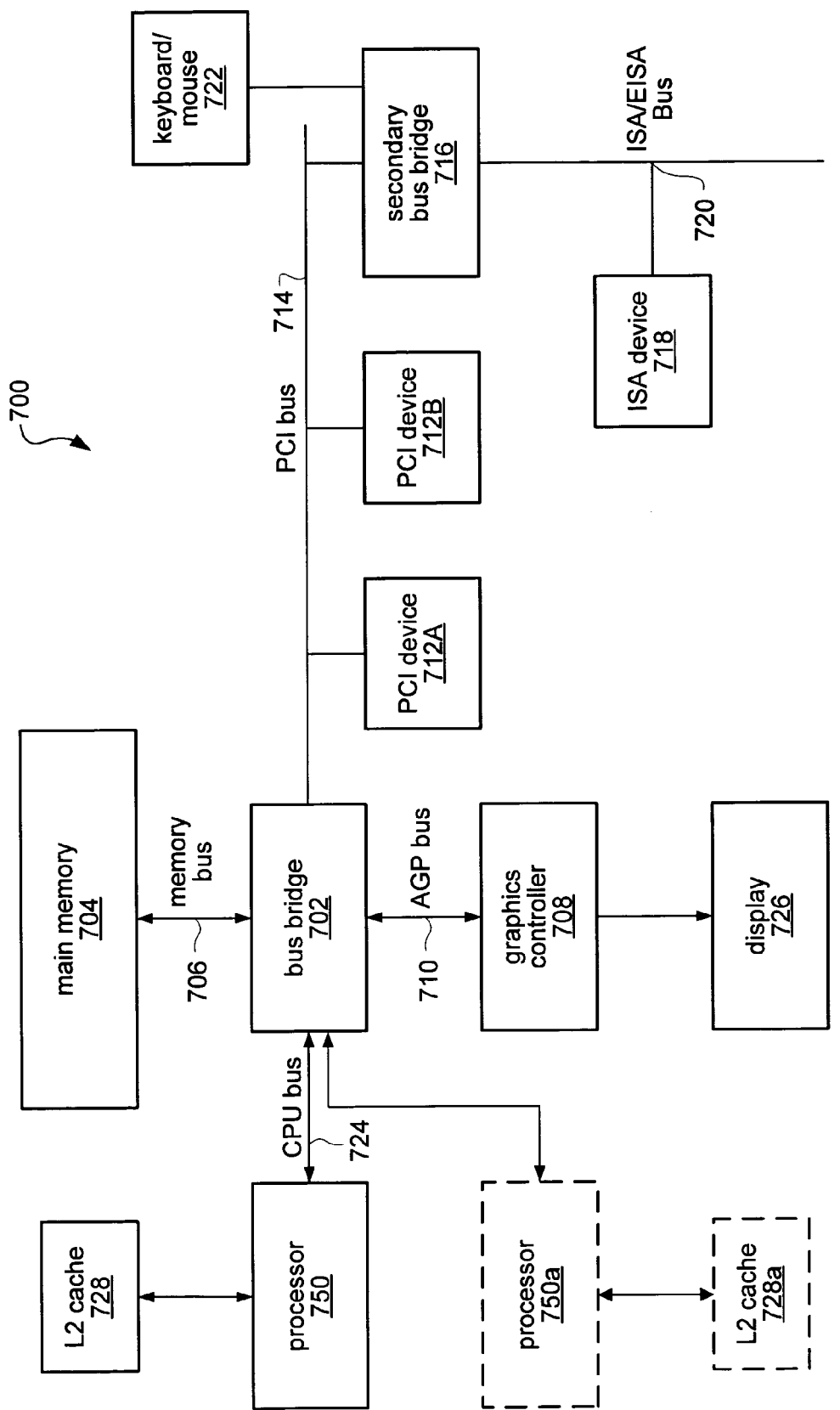
FIG. 7 is a block diagram illustrating an exemplary computer system capable of testing/debugging multiple logic cores via a shared test access port, according to one embodiment.

As described above, a single debug port may be utilized to test/debug multiple logic cores of multi-core integrated circuit, such as a multi-core processor. FIG. 7 is a block diagram illustrating of one embodiment of an exemplary computer system 700 that may include one or more multi-core integrated circuits for which individual logic core may be debugged or tested via a single debug port, as described herein. For instance, computer system 700 may include one or more microprocessors 750 coupled to a variety of system components through a bus bridge 702. Microprocessor 700 may be a multi-core microprocessor and include multiple logic cores 120, as described above. In some embodiments, one or more of the logic cores 120 of microprocessor 700 may be debugged or tested via a single debug port, such as test access port 110, as described above. Microprocessor 750 may be coupled to bus bridge 702 through a CPU bus 724 and to an optional L2 cache 728, according to some embodiments. Other embodiments of a computer system are possible and contemplated. In the depicted system, a main memory 704 is coupled to bus bridge 702 through a memory bus 706, and a graphics controller 708 is coupled to bus bridge 702 through an AGP bus 710, according to one embodiment. Several PCI devices 712A-712B are coupled to bus bridge 702 through a PCI bus 714. A secondary bus bridge 716 may also be provided to accommodate an electrical interface to one or more EISA or ISA devices 718 through an EISA/ISA bus 720, according to some embodiments.

Bus bridge 702 may provide an interface between microprocessor 750, main memory 704, graphics controller 708, and devices attached to PCI bus 714. When an operation is received from one of the devices connected to bus bridge 702, bus bridge 702 may identify the target of the operation (e.g., a particular device or, in the case of PCI bus 714, that the target is on PCI bus 714). Bus bridge 702 routes the operation to the targeted device. Bus bridge 702 generally translates an operation from the protocol used by the source device or bus to the protocol used by the target device or bus.

In addition to providing an interface to an ISA/EISA bus for PCI bus 714, secondary bus bridge 716 may incorporate additional functionality. An input/output controller (not shown), either external from or integrated with secondary bus bridge 716, may also be included within computer system 700 to provide operational support for a keyboard and mouse 722 and for various serial and parallel ports. An external cache unit (not shown) may also be coupled to CPU bus 724 between microprocessor 750 and bus bridge 702 in other embodiments. Alternatively, the external cache may be coupled to bus bridge 702 and cache control logic for the external cache may be integrated into bus bridge 702. L2 cache 728 is shown in a backside configuration to microprocessor 750. It is noted that L2 cache 728 may be separate from microprocessor 750, integrated into a cartridge (e.g., slot 1 or slot A) with microprocessor 750, or even integrated onto a semiconductor substrate with microprocessor 750.

Main memory 704 is a memory in which application programs are stored and from which microprocessor 750 primarily executes. A suitable main memory 704 may include DRAM (Dynamic Random Access Memory). For example, a plurality of banks of SDRAM (Synchronous DRAM) or Rambus DRAM (RDRAM) may be suitable.

PCI devices 712A-712B are illustrative of a variety of peripheral devices such as network interface cards, video accelerators, audio cards, hard or floppy disk drives or drive controllers, SCSI (Small Computer Systems Interface) adapters and telephony cards. Similarly, ISA device 718 is illustrative of various types of peripheral devices, such as a modem, a sound card, and a variety of data acquisition cards such as GPIB or field bus interface cards.

Graphics controller 708 is provided to control the rendering of text and images on a display 726. Graphics controller 708 may embody a typical graphics accelerator generally known in the art to render three-dimensional data structures that can be effectively shifted into and from main memory 704. Graphics controller 708 may therefore be a master of AGP bus 710 in that it can request and receive access to a target interface within bus bridge 702 to thereby obtain access to main memory 704. A dedicated graphics bus accommodates rapid retrieval of data from main memory 704. For certain operations, graphics controller 708 may further be configured to generate PCI protocol transactions on AGP bus 710. The AGP interface of bus bridge 702 may thus include functionality to support both AGP protocol transactions as well as PCI protocol target and initiator transactions. Display 726 is any electronic display upon which an image or text can be presented. A suitable display 726 includes a cathode ray tube ("CRT"), a liquid crystal display ("LCD"), etc.

It is noted that, while the AGP, PCI, and ISA or EISA buses have been used as examples in the above description, any bus architectures may be substituted as desired. It is further noted that computer system 700 may be a multiprocessing computer system including additional microprocessors (e.g., microprocessor 750a shown as an optional component of computer system 700). Microprocessor 750a may be similar to microprocessor 750. More particularly, microprocessor 750a may be an identical copy of microprocessor 750 in one embodiment. Microprocessor 750a may be connected to bus bridge 702 via an independent bus or may share CPU bus 724 with microprocessor 750. Furthermore, microprocessor 750a may be coupled to an optional L2 cache 728a similar to L2 cache 728.

Various components illustrated as part of computer system 700 may be or include multi-core integrated circuits that include multiple logic cores but only a single debug port. As noted above, microprocessor 750 or 750a may represent an embodiment of integrated circuit 100, described above, and may be configured to implement debugging and/or testing of individual logic cores via a single debug port, as described herein. Additionally, graphics controller 708, any of PCI devices 712, and/or ISA device 718 may also include embodiments of multi-core integrated circuits and may be configured to implement testing and/or debugging on of multiple logic cores via a single, shared test access port 110, as described herein.

As used herein, the terms "clock cycle" or "cycle" refer to an interval of time in which the various stages of the instruction processing pipelines complete their tasks. Instructions and computed values are captured by memory elements (such as registers or arrays) according to a clock signal defining the clock cycle. For example, a memory element may capture a value according to the rising or falling edge of the clock signal.

Numerous variations and modifications will become apparent to those skilled in the art once the above disclosure is fully appreciated. It is intended that the following claims be interpreted to embrace all such variations and modifications.

What is claimed is:

1. An integrated circuit, comprising:
a plurality of logic cores;
a debug controller coupled to each of the plurality of logic cores;
a test access port coupled to the debug controller and configured to provide an external interface to the debug controller; and
a core mask register configured to store a value indicating a selected one or more of the plurality of logic cores, wherein the core mask register is writable via the test access port;
wherein the debug controller is configured to switch the selected one or more logic cores from a normal mode of execution to a debug mode;
wherein, while in the normal execution mode, each of the logic cores is configured to execute program instructions;
wherein, while in the debug mode, each of the logic cores is configured to perform debug operations controlled by the debug controller according to commands received via the test access port; and
wherein each of the logic cores is capable of operating in the normal execution mode simultaneously with at least another one of the logic cores operating in the debug mode.

2. The integrated circuit of claim 1, wherein the debug controller comprises a plurality of core debug controllers each coupled to a respective one of the plurality of logic cores, wherein to perform the debug operations on one or more of the plurality of logic cores, the debug controller is configured to route commands received via the test access port to one or more of the respective core debug controllers based upon the value stored in the core mask register.

3. The integrated circuit of claim 1, wherein to perform said debug operations the debug controller is further configured to store a value to a register of each of the one or more of the plurality of logic cores indicated by the value stored in the core mask register based upon a single write command received via the test access port.

4. The integrated circuit of claim 1, wherein the test access port is a IEEE 1149.1-1990 compliant test access port.

5. The integrated circuit of claim 1, wherein the test access port is configured to disable the normal mode of operation and enter a pass-through mode in response to an input command, wherein while in the pass-through mode, the test access port is further configured to forward any received data or commands to the debug controller.

6. The integrated circuit of claim 1, wherein the debug controller is configured to request the one or more logic cores to enter the debug mode in response to the assertion of a DBREQ signal from test equipment external to the integrated circuit.

7. The integrated circuit of claim 1, wherein the debug controller is further configured to assert a DBRDY signal to test equipment external to the integrated circuit in response to the one or more logic cores entering the debug mode.

8. The integrated circuit of claim 1, wherein the debug controller is configured to execute one or more debug operations on at least one of the one or more of the plurality of logic cores based upon a command received via the test access port, wherein the received command indicates the at least one of the one or more of the plurality of logic cores.

9. The integrated circuit of claim 1, wherein each of the plurality of logic cores is configured to disable the normal mode of operation and enter the debug mode in response to encountering a breakpoint during processing, and wherein in response to one or more of the plurality of logic cores entering the debug mode, the debug controller is configured to assert a DBRDY signal to test equipment external to the integrated circuit to indicate that the one or more of the plurality of logic cores have entered the debug mode.

10. The integrated circuit of claim 9, wherein the debug controller is configured to assert the DBRDY signal only after every logic core indicated by the core mask register has entered the debug mode.

11. A method, comprising:
storing a value in a core mask register of a multi-core integrated circuit via a test access port of the integrated circuit, wherein the value indicates a selected one or more of a plurality of logic cores of the integrated circuit;
the multi-core integrated circuit receiving a debug request signal to request that the selected one or more of the plurality of logic cores of the integrated circuit switch from a normal mode of execution to a debug mode, wherein while in the debug mode, each selected logic core is configured to perform debug operations controlled by a debug controller of the integrated circuit according to debug commands received via the test access port;
in response to receiving one or more debug commands, the debug controller issuing one or more debug operations to each of the selected one or more of the plurality of logic cores; and
simultaneously with the selected one or more of the plurality of logic cores operating in the debug mode, the logic cores not selected to switch from the normal mode of execution to the debug mode remaining in normal execution mode and executing program instructions.

12. The method of claim 11, further comprising
the debug controller issuing the one or more debug operations to each of the selected one or more of the plurality of logic cores according to the value stored in the core mask register.

13. The method of claim 12, wherein the debug controller issues each of the one or more debug operations simultaneously to each of the one or more of the plurality of logic cores indicated by the value stored in the core mask register.

14. The method of claim 11, wherein the debug controller comprises a plurality of core debug controllers each coupled to a respective one of the plurality of logic cores, and wherein the debug controller is configured to issue each of the one or more debug commands to a corresponding one of the plurality of core debug controllers, wherein in response to receiving the one or more debug commands from the debug controller, each of the plurality of core debug controllers is configured to implement each of the one or more debug operations on the respective one of the plurality of logic cores.

15. The method of claim 11, wherein the test access port is a IEEE 1149.1-1990 compliant test access port.

16. The method of claim 11, further comprising the test access port disabling a normal mode of operation an entering a pass-through mode in response to an input command, wherein while in the pass-through mode, the test access port is configured to forward any input data or commands to the debug controller.

17. The method of claim 11, further comprising:
asserting a DBREQ signal from test equipment external to the integrated circuit; and
in response to said asserting, the debug controller requesting the one or more of the plurality of logic cores to enter the debug mode.

18. The method of claim 11, further comprising the debug controller asserting a DBRDY signal to test equipment external to the integrated circuit in response to the one or more of the plurality of logic cores entering the debug mode.

19. The method of claim 11, further comprising the debug controller executing one or more debug operations on at least one of the one or more of the plurality of logic cores based upon a debug command received via the test access port, wherein the received command indicates the at least one of the one or more of the plurality of logic cores.

20. A computer system, comprising:
a system memory; and
a multi-core microprocessor coupled to the system memory, comprising:
a plurality of processor cores;
a debug controller coupled to each of the plurality of processor cores;
a test access port coupled to the debug controller and configured to provide an external interface to the debug controller; and
a core mask register configured to store a value indicating a selected one or more of the plurality of logic cores, wherein the core mask register is writable via the test access port;
wherein the debug controller is configured to switch the selected one or more logic cores from a normal mode of execution to a debug mode;
wherein, while in the normal execution mode, each of the logic cores is configured to execute program instructions;
wherein, while in the debug mode, each of the logic cores is configured to perform debug operations controlled by the debug controller according to commands received via the test access port;
wherein each of the logic cores is capable of operating in the normal execution mode simultaneously with at least another one of the logic cores operating in the debug mode.

* * * * *

UNITED STATES PATENT AND TRADEMARK OFFICE
CERTIFICATE OF CORRECTION

PATENT NO. : 7,665,002 B1  
APPLICATION NO. : 11/302942  
DATED : February 16, 2010  
INVENTOR(S) : White et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 411 days.

Signed and Sealed this

Seventh Day of December, 2010

David J. Kappos  
*Director of the United States Patent and Trademark Office*